United States Patent [19]

Rice et al.

[11] 4,348,760
[45] Sep. 7, 1982

[54] DIGITAL-FAULT LOOP PROBE AND SYSTEM

[75] Inventors: Steven J. Rice, Redlands; Donald E. Sherman, Mission Hills, both of Calif.

[73] Assignee: Lockheed Corporation, Burbank, Calif.

[21] Appl. No.: 190,684

[22] Filed: Sep. 25, 1980

[51] Int. Cl.³ .............................................. G01R 31/28
[52] U.S. Cl. ................................. 371/20; 324/73 AT; 371/25
[58] Field of Search ...................... 371/20, 26, 25, 15; 324/73 R, 73 AT; 364/200, 900

[56] References Cited

U.S. PATENT DOCUMENTS

| | | | |
|---|---|---|---|
| 3,497,685 | 2/1970 | Stafford et al. | 371/26 |
| 3,976,864 | 8/1976 | Gordon et al. | 371/26 |
| 4,180,203 | 12/1979 | Masters | 371/20 |
| 4,192,451 | 3/1980 | Swerling et al. | 371/20 |
| 4,194,113 | 3/1980 | Fulks et al. | 371/20 |
| 4,228,537 | 10/1980 | Henckels et al. | 371/20 |

*Primary Examiner*—Charles E. Atkinson

[57] ABSTRACT

The invention is a process and system for locating and identifying faulty components or faults in a circuit board (16) under test. The system includes a guided-logic probe box (20) that includes a hand held needle-tipped probe (30) and three circuit boards (32), (36) and (38), which detect and present information as to the type of signal being input to the probe needle (82). The information is presented to a human via a light (84) on the hand probe (30) and/or by three LED lights (41), (42) and (43) on the probe housing (22). The circuit board (36) includes two circuits (100) and (120). Circuit (120) is a logic separator circuit and includes latches ($L_1$) and ($L_2$), which gather and present information to the computer (78) of an automatic test system unit (10) via the pins (158) and (159). After acceptance by the computer (78), the computer can send back a signal via the pin (160) to reset latches ($L_1$) and ($L_2$) which are then free to probe another node. The testing process includes a series of steps, as set forth in the flow chart (130) which enables the system to determine what component or components are faulty in a signal loop.

25 Claims, 13 Drawing Figures

DIGITAL-FAULT LOOP PROBE AND SYSTEM

TECHNICAL FIELD

The invention relates generally to systems and processes for testing circuits and for locating and identifying faulty components therein, and more specifically, is directed to a system and process for locating one or more faulty components in a circuit, whether the component(s) are located in a signal loop or not.

BACKGROUND ART

Avionics systems have become a significant feature in all aerospace systems and, in many cases, the avionics predominates in the total system. As the state of the art is advanced and implemented, the complexity and circuit density factor of the avionics is increased geometrically.

The ability to identify and repair or replace failed components in these complex avionics systems correlates directly to the success of the avionics systems. No matter how elegant, well designed, and functional a system is, if it is not kept in working order, it will be of no practical use. Automatic test equipment has the most promise in being able to handle the variety and complexity of present and future avionics in a timely manner.

There are two basic ways to isolate logic failures within a digital circuit, fault signature isolation and probed fault isolation. The general difference is that the fault signature approach uses data available on the circuit output pins to determine the location of a fault, and the probed fault isolation approach uses data on the component pins. The primary difference between the two approaches is in the assumptions made. Specifically, that for a fault dictionary, each failure that is to be isolated must be characterized and simulated, whereas in a proble isolation approach, all failures that affect the logic function of a circuit will be isolated because only the normal function of the circuit need be characterized.

In order to utilize automatic test equipment, two areas of understanding are required: the normal operation of the circuit in order to determine whether or not the circuit is functioning; and the ways in which the circuit can fail in order to identify the location of the failure. Due to the complexity of most modern avionics, there is too much detail of operation in most circuit functions to be determined by manual means. A good computer-aided program preparation system does the drudgerous, time-consuming work of simulating the detail functions of a circuit and provides information about circuit activities to the analyst so that the test can be developed.

Typically, the development costs of a probe-isolated test is less than for an equivalent fault dictionary test, because the analyst need not run a fault simulation for each fault, and the model of the circuit need not include all of the fault-mode representations of the circuit. Because these two items do not have to be dealt with, the calendar time required for test program development is reduced.

There are several automatic test systems presently in use, as for example, the Hybrid Automatic Test System (HATS), manufactured by General Dynamics Corp. In this system, a model of the circuit board to be tested (called a LASAR model) is generated from circuit schematics and the like. In the system process, an equivalent NAND model of the circuit is generated, and node numbers are assigned to the various nodes. A pattern set is then generated by applying voltages to the circuit input pins and ascertaining the voltages on the output pins. The patterns are generated by reapplying different combinations of input voltages, getting the different output voltages. Each combination is a pattern set. This operation is carried out sequentially to establish a complete pattern set. In effect, an attempt is made to exercise everything in the circuit, and that is reflected on the output nodes. When a node is probed, HATS, utilizing a computer, automatically determines if the node is in the state is should be in, and checks the voltages on all nodes.

The problem, however, with library types of detection systems, lies in the frequent existence of ambiguity groups. As an example, using output pins on a unit under test to determine faults, and assuming five hundred or more patterns tested, it would not be unusual to find as many as ten or more incorrect outputs, that is, certain pin combinations that have the wrong voltages on them. In these circumstances, the HATS goes to the library, where a match of failure patterns may include as many as ten or more different nodes. The tester or technician thus may have to change many parts on the circuit board.

Stated another way, one of the primary areas of difficulty in prior art automatic test systems is that of signal loops in the circuit. A signal loop manifests itself when a failure occurs in a circuit in such a way as to cause both the inputs and outputs of several components to show erroneous states simultaneously, all the components arranged topologically in a loop structure. The problem is then to identify where in the loop the failure actually occurred.

Ambiguity of failure location within the loop causes components that have no failure to be replaced, which utilizes unnecessary manpower, spares, and runs a high risk of circuit board damage.

One approach to circuit testing has been the use of manually operated logic probes, such as the Hewlett-Packard Model 10525T Logic Probe. This probe detects and indicates valid logic levels, the presence and polarity of single pulses of 10 nanoseconds or greater in duration, and intermediate or "BAD" logic levels, such as an open input on a TTL (transistor transistor logic) gate or an open circuit, etc. The probe includes a logic level indicator lamp at the probe tip which gives the user an immediate indication of the logic states in the circuit under test. The lamp normally shines dim, and is driven to bright for inputs above a rough logic one threshold and to off for inputs below a rough logic zero threshold. At voltage levels between the logic one and zero thresholds, and for open circuits, the lamp remains dim. The lamp will flash on and off at about ten times per second for pulse train inputs greater than about 10 $H_z$. The logic probe suffers from several disadvantages. Power supply potentials more positive than plus seven volts or more negative than minus fifteen volts will cause probe damage. The probe works on only one logic family, namely, TTL, and does not clearly identify and differentiate when it is in a forbidden zone of voltage. Additionally, the probe does not differentiate and distinguish between different types of pulses, for example, square wave pulses. Finally, the logic probe is not adapted to be readily usable with an automatic test system.

A more efficient, flexible and utilizable guided logic probe is disclosed in copending U.S. Patent Application Ser. No. 191,048, filed Sept. 25, 1980, for "Guided-Logic Probe", assigned to the assignees herein. The application discloses an improved guided-logic probe which performs greatly improved manual testing functions, but also deals with inclusion in the probe of suitable circuitry that make it readily adaptable to function in conjunction with the computer of an automatic test system, as for example the computer used in the HATS. The disclosure of the aforementioned copending application is hereby incorporated by reference. While the probe is of improved design for use both manually and/or in conjunction with an automatic test system, it nevertheless is not an automatic system and cannot, in and of itself, solve the fault ambiguity problems discussed hereinabove.

In view of the problems associated with the aforementioned prior art approaches, there is a need to develop an efficient system and apparatus for testing circuits and locating and identifying faulty components therein.

From the foregoing, it can be seen that it is a primary object of the present invention to provide a novel test system and process for testing circuits, and for identifying and locating faulty components therein.

It is a further object of this invention to provide a novel test system and process which can readily locate and identify a faulty signal loop within a circuit, and which can then identify the component or components within the loop which actually failed.

It is another object of this invention to provide a novel automatic guided-probe system which works in conjunction with existing automatic test equipment and systems.

It is yet another object of the present invention to provide a digital-fault loop probe and system which provides improved resolution in identifying a smaller segment for the probable cause of failure in a circuit than existing test systems, and a more reliable indication of the cause of failure.

It is a further object of the present invention to provide a process and system for converting an existing dynamic automatic test system into a dynamic automatic test system tht will perform guided-probe fault isolation and reduce the possibility of ambiguity of failure location as a result of failure within a circuit signal loop.

DISCLOSURE OF INVENTION

The digital fault loop probe and system of the present invention provides a process and means for testing circuits. In accordance with the invention, an existing automatic test system is modified to provide an improved, efficient, multi-faceted guided-probe device which is adapted for and operates with the automatic test system such that the modified test system has a guided-probe capability. The process and system includes steps and means whereby a hand probe is directed to be applied at certain specific locations on a circuit board in order to determine fault locations, even within a signal loop.

The inventive process and system includes, but is not limited to, the following key elements:

(1) Use of an existing automatic test system and process steps.
(2) Development of a novel guided-logic probe which not only has utility for manual use, but which also is adapted to be readily and easily interfaced with the test station and/or computer (or the like) of an existing automatic test system.
(3) Development of a test process which enables solution of a faulty signal loop, that is, which enables a tester to locate a faulty component or components within a circuit signal loop.
(4) Development of a novel overall process and system, combining the aforementioned elements, for testing circuits, thereby obtaining improved resolution in identifying the probable cause of failure and a more reliable indication of the cause(s) of failure.

The novel features which are believed to be characteristic of the invention, both as to its organization and its method of operation, together with further objects and advantages thereof, will be better understood from the following description, taken in connection with the accompanying drawings, in which presently preferred embodiments of the invention are illustrated by way of example. It is to be expressly understood, however, that the drawings are for purposes of illustration and description only, and are not intended as a definition of the limits of the invention.

BEST MODE OF CARRYING OUT THE INVENTION

In order to utilize automatic test equipment it is essential that the normal operation of the circuit under test be understood. It is also necessary to understand the ways in which the circuit can fail in order to identify the location of the failure. Due to the complexity of most modern avionics, there is too much detail of operation in most circuit functions to be determined by manual means. As stated hereinabove, a good computer-aided program preparation system does the drudgerous, time-consuming work of simulating the detail functions of a circuit and provides information about circuit activities to the analyst so that the test can be developed. Several approaches to circuit simulation are readily available, as for example the equivalent gate (LASAR) approach. This simulation system is an algorithm that approximates the real-world activity of a circuit.

A large part of test program set development time is involved in dealing with hybrid circuitry; i.e., both analog and digital components imbedded in the same circuit, especially when one type is imbedded in the other. It has been that, by utilizing a compiler-driven simulator, part of the flexibility of a compiler-driven processor is that of being able to process nondigital functions in a digital environment, allowing for a level of direct analog simulation. Also, if an analog circuit can be expressed as a transfer function, then the circuit can be simulated in the functional simulator. Most circuit blocks can be approximated adequately by such an approach.

In accordance with the present invention a novel digital guided-probe system and process is provided for use on and with existing automatic test systems, in this case, the AN/USM-403 Hybrid Automatic Test System (HATS) manufactured by the General Dynamics Corporation. The HATS system is a dynamic system that digitally tests with time constraints imposed on the stimulus and response. Its programmable interface unit (PIU) offers wide flexibility in logic families that can be tested.

In order to utilize the HATS system to practice the process of the present invention the Abbreviated Test Language for Avionics Shops (ATLAS) software system of HATS has to be changed to some degree to support the guided-probe of the present invention.

In accordance with a first aspect of the present invention, conversion of an existing automatic test system to an automatic guided-probe test system may be accomplished by utilization of the novel guided-probe box of the present invention, and a modified program disc of the operating system disc used by the existing automatic test system, in this case HATS, stations. From the users point of view, the only change to ATLAS for example, might be the addition of a new syntax element, a "DO, GUIDED PROBE" statement.

Figure 1A:
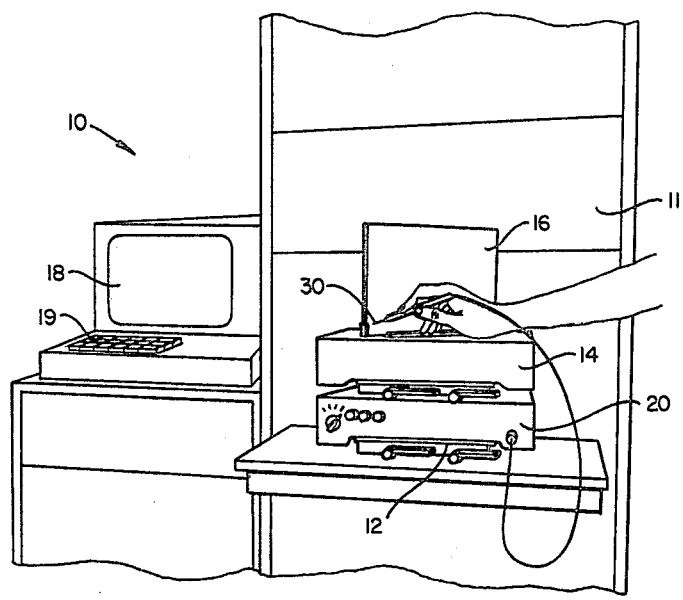
FIG. 1A is a perspective view of an automatic test system station showing a guided-probe box in accordance with one aspect of the present invention interposed between the automatic test system connector and interface adapter device.
Figure 1B:
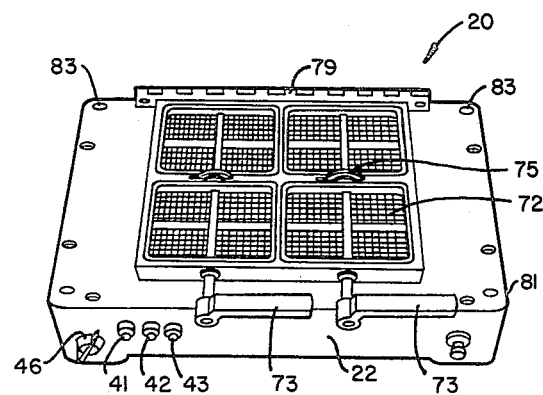
FIG. 1B is a perspective view of the guided-probe box of FIG. 1A.

Referring to FIGS. 1A and 1B, a HATS (10) is shown with a guided-logic probe box (20) interposed between the HATS station interface connector (12) and the HATS interface adapter device (14), in accordance with this invention. Under normal operation, without the novel modifications of the present invention, the unit under test, circuit board (16), would be connected to the connector (12) via the adapter device (14). The adapter device (14) includes a suitable socket on top (not shown) for connection to the circuit board (16), and a female ZIF connector on the bottom for connection to the HATS station interface connector (12). The HATS also includes the CRT screen (18), the keyboard (19), and the HATS tester or stimulus measurement system (SMS), (11).

Referring now to FIGS. 1B and 3-7, there is shown therein the details of a guided-logic probe (20), including the hand probe (30), in accordance with the present invention. The hand probe (30) includes a probe circuit board (32), while the housing (22) of the guided-logic probe (20) encloses the power supply, state processor, and filter circuit boards (34), (36) and (38), respectively. Also mounted to the housing (22) are three LED lights (41), (42) and (43), and a logic family selection switch (46). A logic family selection switch circuit board (48) is mounted on the inside of the housing (22).

A transformer (50) is secured to the housing (22) by two screws (52), and is supplied power via the power cord (54) and wall plug (56). The transformer (50) steps down the voltage supplied via a wall outlet and delivers it to the power supply circuit board (34). The circuit breaker (58) and adapter (59) are utilized in known manner and form no part of this invention. The retaining clips (62) and (64) on the exterior of the housing (22) are utilized to hold and secure the wall plug (56) and hand probe (30) when the unit and the hand probe are not in use. The female receptacle (66) is adapted to receive the male connector (68) on the end of cord (69) of the hand probe (30).

Figure 2:
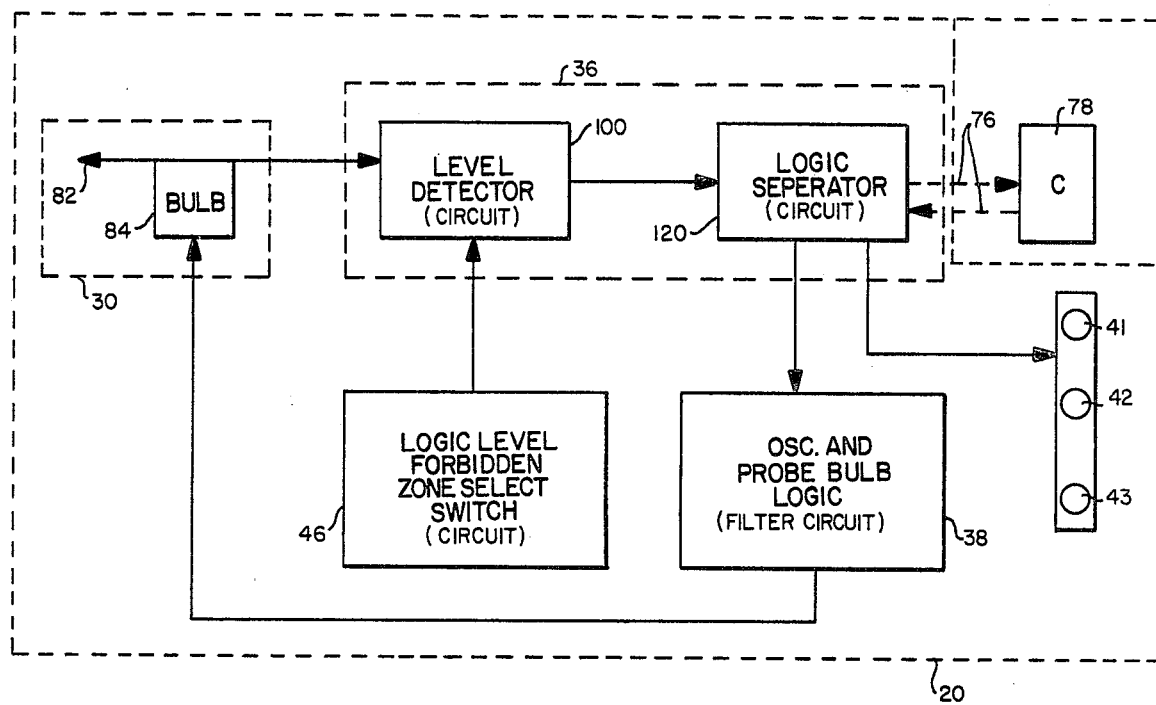
FIG. 2 is a block diagram showing the flow of voltage signals from a hand probe portion of the guided-logic probe box of this invention to various analyzing circuits within the guided-logic probe, and also showing signals delivered to and from a computer which is a part of the automatic test system of FIG. 1.

The guided-logic probe of the present invention is shown in FIGS. 1B and 3-5 to include four quadrant male zero-insertion-force (ZIF) connector (72), and four quadrant female ZIF connector (74). These connectors enable the guided-logic probe (20) to be optionally connected to existing automatic test systems, such as for example, the General Dynamics Corporation Hybrid Automatic Test System (HATS). For this purpose the latching handles (73) can be utilized to operate the rotatable claw latches (75), to thereby secure the housing (22) to an upper element (not shown) of the HATS. Reference is made to FIG. 2, wherein the elements of the guided-logic probe (20) are shown in block form connected via the dotted lines (76) to the computer (78) of the HATS.

When the guided-logic probe (20) is not in use, a cover (80) is provided which fits over the top of the probe box and covers the ZIF connector (72). Any suitable means may be used to retain the cover (80) in place, as for example the spring retainer-guide holes (83), which may operate with aligned prongs (not shown) projecting from the cover (80).

As will be discussed hereinafter, one of the primary benefits of the guided-logic probe of the present invention is that it has great utility as an independent testing device, or optionally, as a source of data which may be used by or in conjunction with another testing system, such as HATS.

In the embodiment of FIG. 1B, a hinge (79) is provided to permit easy lifting of the top (81) of housing (22) upon removal of the screws (85), thereby permitting access to the interior of the housing (22). While FIG. 3 depicts other elements, such as a tipjack (82), the contact (84), and various other elements, a more detailed description of the operation and key elements of a guided-logic probe (20) can be had by reference to the schematic diagrams of the digital circuits set forth in FIGS. 8-10.

Figure 3:
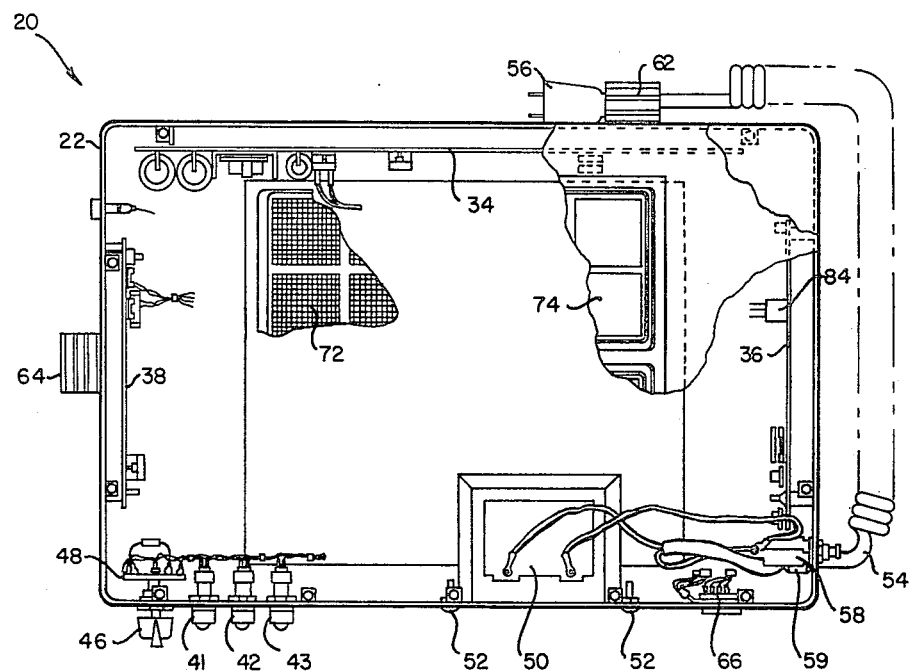
FIGS. 3–5 are top, front and side views, respectively, of the guided logic probe box.
Figure 4:
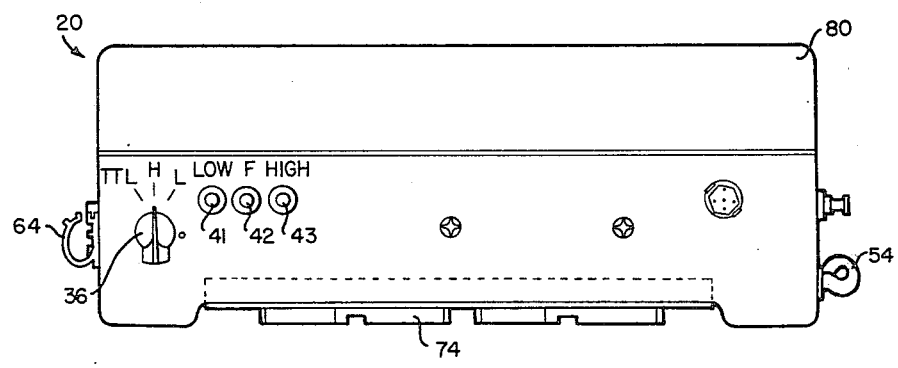
Figure 5:
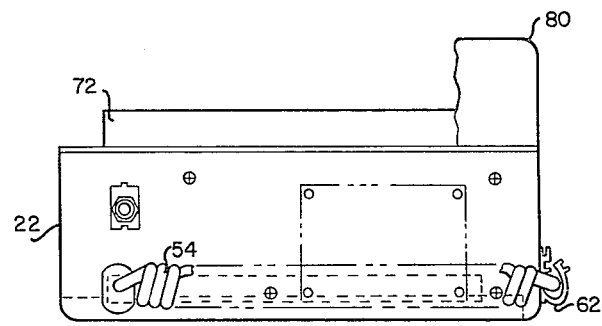
Figure 8:
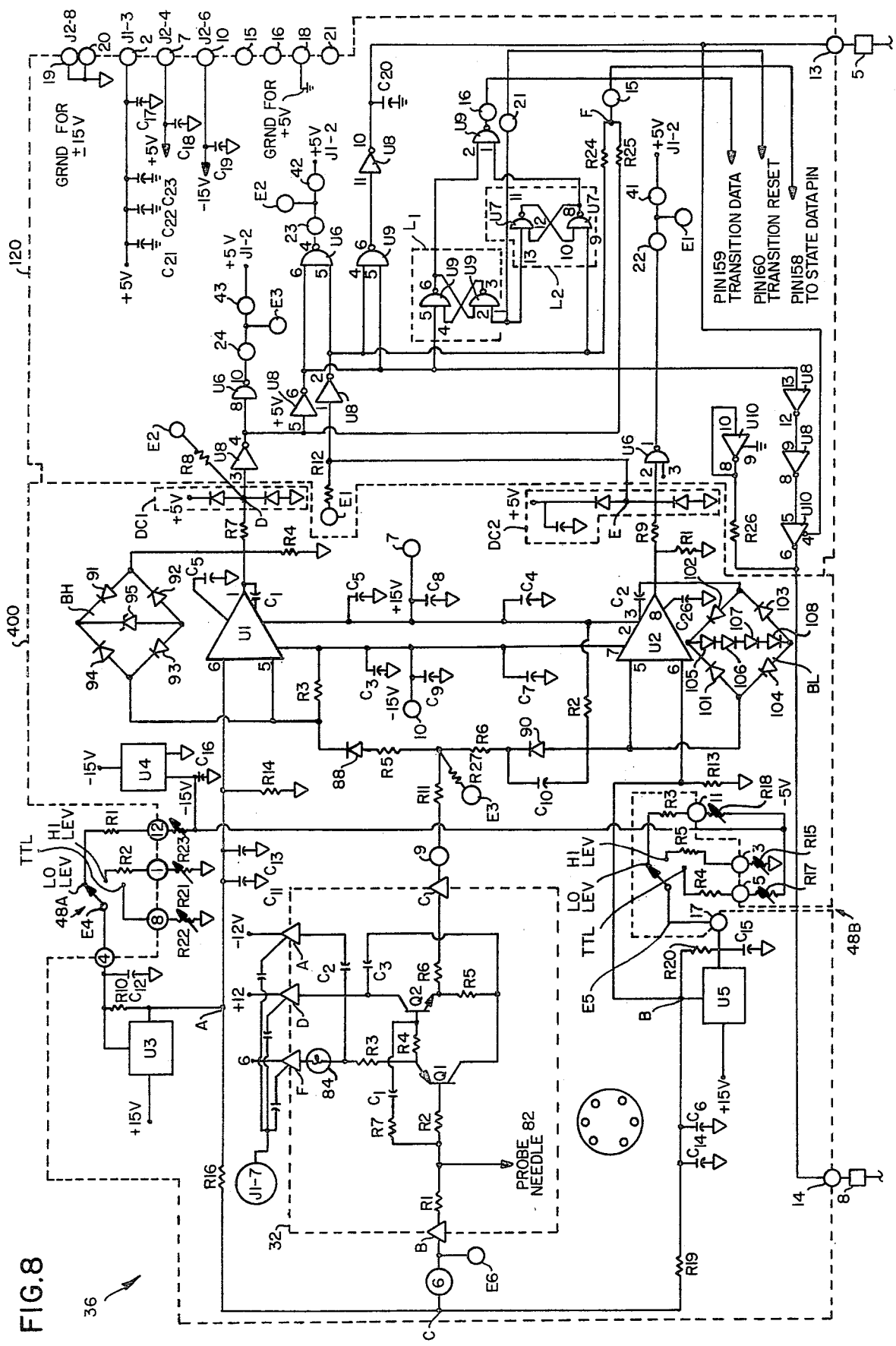
FIG. 8 is a schematic diagram of the state processor digital circuit of the guided probe box of this invention.

The state processor circuit board (36) of FIGS. 3 and 8 is seen to include a signal level detector circuit (100) and a signal logic separator circuit (120). For purposes of clarity, the schematic diagram of the hand probe circuit board (32), and the switch circuit board (48), have been interposed on the schematic of the state processor circuit board (36). It should be understood, however, that the hand probe circuit board (48) board is mounted within the hand probe (30) and the switch circuit is within housing (22), respectively, and are not a part of the state processor circuit board (36). The logic family selection switch circuit board (48) is shown in two sections (48A) and (48B) in FIG. 8.

The logic family selection switch (46) is utilized to establish the forbidden zone bias of the guided-logic probe (20). It includes five resistors ($R_1$)-($R_5$). Potentiometrs ($R_{15}$), ($R_{17}$), ($R_{18}$), ($R_{21}$), ($R_{22}$) and ($R_{23}$), (part of the level detector circuit (100)), are utilized as follows: ($R_{17}$) and ($R_{22}$) may be varied to adjust the forbidden zone bias for the "TTL" switch setting; ($R_{15}$) and ($R_{21}$) may be varied to adjust the "Hi Level" switch setting; and ($R_{18}$) and ($R_{23}$) may be varied to adjust the "Lo Level" switch setting. When the potentiometers are adjusted, voltages are established at points (A) and (B). The sum of these voltages appears at point (C) in the circuit of FIG. 3. The voltage at points (A) and (B) can also be seen to establish the bias for the high output amplifier ($U_1$) and the low output amplifier ($U_2$), the operation of which will be described hereinbelow.

Figure 9:
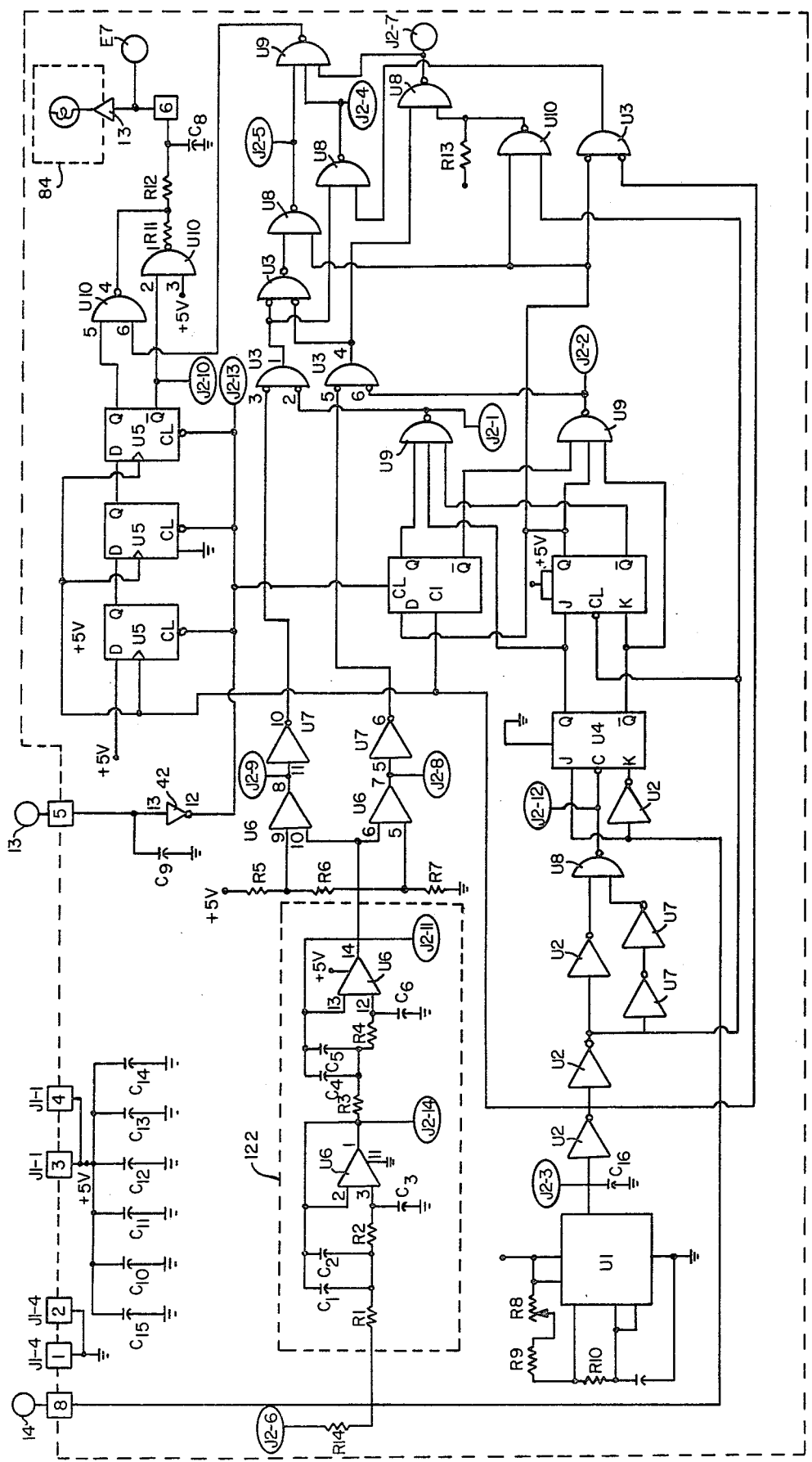
FIG. 9 is a schematic diagram of the oscillator and probe bulb logic (filter) digital circuit of the guided-probe box of this invention.
Figure 10:
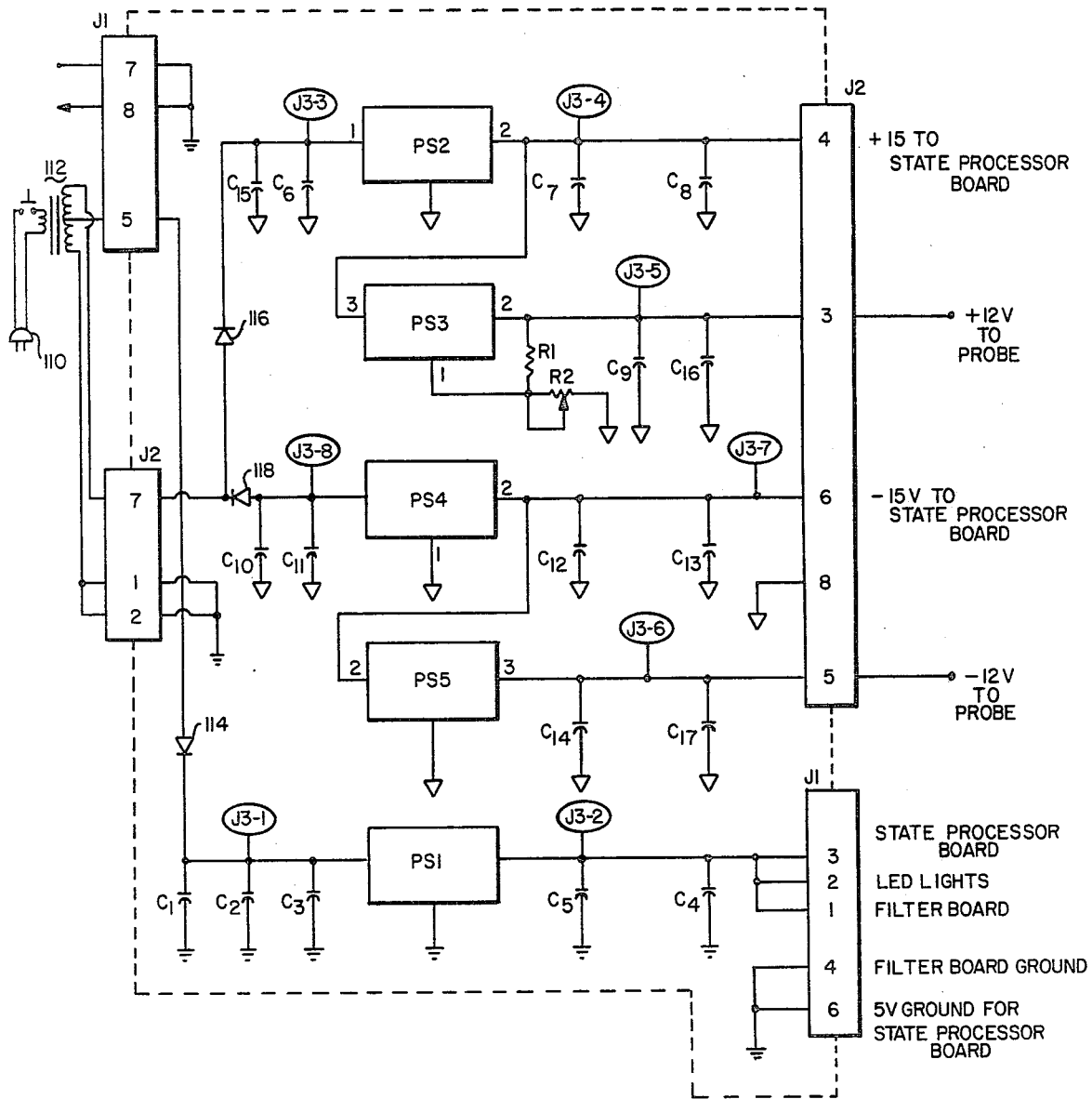
FIG. 10 is a schematic diagram of the power supply digital circuit of the guided-probe box of this invention.

Table I shows the values of the resistive and capacitive devices, including several filter capacitors, shown in the circuit schematics of FIGS. 8, 9 and 10 in order to establish the following switch setting-probe system parameters:

|     | TTL  | Hi Level | Lo Level |
| --- | ---- | -------- | -------- |
| Hi  | 2.4V | 4V       | +1V      |
| Lo  | .8V  | 2V       | −1V      |

Figure 6:
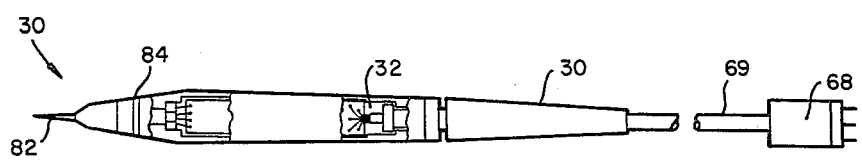
FIG. 6 is a view, partially broken away, of the hand probe portion of the guided logic probe box of the present invention.
Figure 7:
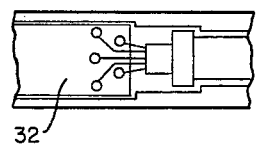
FIG. 7 is a detail taken within set-out A of FIG. 6.

As seen in FIGS. 6 and 7, the hand probe (30) includes three basic elements, that is, the probe needle (82), the bulb (84), and the circuit board (32), the schematic of which is shown interposed on FIG. 8. The hand probe circuit includes the seven current limiting resistors ($R_1$)-($R_7$), the speed up capacitor ($C_1$), the filter capacitors ($C_2$) and ($C_3$), and the transistor amplifiers ($Q_1$) and ($Q_2$). The input to the probe goes first to the transistor amplifier ($Q_1$), and then to the transistor amplifier ($Q_2$) via resistor ($R_4$) and the speed up capacitor ($C_1$), which injects current into transistor amplifier ($Q_2$), making it respond faster. Typically, a loss of 0.7V would occur across the PNP amplifier ($Q_1$). In utilizing a transistor amplifier ($Q_2$) of the opposite type; namely, an NPN transistor, a gain of 0.7V occurs. The net result therefore, is that the output of the probe follows the input.

Throughout the schematic circuits of FIGS. 8-10 the several terminals, leads, through-connections, pins and the like, for connecting different circuit elements to each other, and different circuit boards to each other, are clearly and uniformly identified. For this reason, they will not be included in the discussion herein of the operation of the various circuits of the guided-logic probe (20), unless deemed necessary for clarity of understanding.

A level detector circuit (100) accepts input voltages from the probe circuit, which then are transferred to the two operational amplifiers ($U_1$) and ($U_2$). These amplifiers have been biased for the upper and the lower levels of the forbidden zone. Thus, in the forbidden zone, neither amplifier is transmitting, while Hi and Lo voltages are translated into Hi's and Lo's for a TTL output section (logic separator circuit (120)). The level detector circuit (100) includes several resistors ($R_1$)-($R_{11}$), ($R_{13}$)-($R_{23}$), and ($R_{27}$), several capacitors ($C_1$)-($C_{16}$) and ($C_{24}$)-($C_{26}$), the high and low output amplifiers ($U_1$) and ($U_2$), negative feedback bridges ($B_H$) and $B_L$), the diodes (88) and (90), the positive and negative diode clamps ($DC_1$) and ($DC_2$), and the voltage regulators ($U_3$), ($U_4$) and ($U_5$).

The Hi bridge ($B_H$), which includes four outer loop diodes (91), (92), (93) and (94) and the zener diode (95), provides stability to the high output amplifier ($U_1$). This is necessary because until the high output amplifier ($U_1$) starts transferring a signal, it has extremely high amplification. As soon as it starts transferring, the input amplification is reduced via the Hi bridge ($B_H$), keeping the amplifier from oscillating, that is, the bridge closely controls voltage amplification. In addition, the bridge also prevents the output from changing more than desied which would cause the amplifier to saturate and latch up.

In like manner, the Lo bridge ($B_L$), including the eight diodes (101) through (108), controls oscillation problems and provides stability to the low output amplifier ($U_2$). The structure of the Lo bridge ($B_L$) is different from that of the Hi bridge ($B_H$) because while the upper or high output amplifier ($U_1$) must turn on rapidly, it does not have to turn off rapidly since it doesn't have to go to negative voltage. The low voltage amplifier ($U_2$), on the other hand, must both turn on and turn off rapidly. The multiple diode arrangement of the low bridge ($B_L$) aids in producing this capability.

The positive and negative diode clamps ($CL_1$) and ($CL_2$) are located such that the voltage that can be delivered to the NAND elements ($U_8$) and ($U_6$) cannot go beyond 5V and ground, respectively. Without the diode clamps the possibility of damaging these downstream elements exists.

The logic separator circuit (120) takes the voltages from the high output amplifier ($U_1$) and the low output amplifier ($U_2$) and transfers those into a NAND gate matrix, which then separates out the Hi level signals-lighting the Hi LED light (43); separates out the forbidden zone voltage-lighting the forbidden zone LED light (42); and separates out the low level signals-lighting the Lo LED light (41). Thus at any one time, one of the LED lights will be lit.

FIG. 8 also shows three outputs which may be utilized in conjunction with automatic test systems such as HATS, as for example with the HATS computer (78) (FIG. 2). The pin (158) is the state data pin, while the transition data pin (159) provides a signal which is a latch, and indicates if there has been a change of state for the input signals to the system's replaceable assembly (circuit board). The transition reset pin (160) is a receptacle for a signal from the HATS, and resets the latch when the signal has been accepted by the HATS test station.

Latches ($L_1$) and ($L_2$) are electronic circuits such that if a pulse or voltage is put on, they will put the output into a certain state. That state will remain there regardless of input changes until the latch is reset.

The functioning of a logic separator circuit (120) varies depending on whether the signals are Hi, Lo, or in the forbidden zone. The operation of the circuit will be studied initially with the logic family selection switch (46) set to TTL, and for a forbidden zone voltage. When the voltage input to the probe needle is in the forbidden zone, neither the high output amplifier ($U_1$) nor the low output amplifier ($U_2$) are amplifying. There is thus a Hi voltage (+5V) at point (D), and a Lo voltage at point (E). The Hi at point (D) is inverted through the one input NAND gate ($U_8$), pin (3) to a Lo on ($U_8$), pins (4) and (5). The Lo on ($U_8$), pin (5) is again inverted to a Hi on ($U_8$), pin (6) and therefore on ($U_6$), pin (6). At point (E) there is a Lo, which is then inverted through NAND gate ($U_8$), pin (1) to a Hi at ($U_8$), pin (2), and therefore to a Hi on ($U_6$), pin (5). With a Hi on both pins (5) and (6) of ($U_6$), a Lo is produced on ($U_6$), pin (4).

The forbidden zone LED light (42) has plus 5V on one side, and if (U₆) goes to ground, then there is 5V across the light (42) and it lights.

The Lo signal on (U₆), pin (8) is inverted to a Hi on (U₆), pin (10). Thus, there is a 5V signal on one side of the LED light (43) and a 5V signal on the other side. Since there is no voltage difference, the Hi voltage indicator lamp (43) does not light. In like manner, a Lo signal exists on (U₆), pin (2) and is inverted to a Hi on (U₆), pin (1). Thus, there is plus 5V on both sides of the LED light (41), and with no voltage difference, the Lo voltage indicator lamp (41) does not light.

The latch (L₁) comprises the elements (U₇), pins (4), (5), (6), and (U₇), pins (1), (2), (3), while the latch (L₂) consists of the elements (U₇), pins (9), (10), (11), and (U₇), pins (11), (12), (13). In the forbidden zone the input to latches (L₁) and (L₂) are Hi. A Hi signal also goes to the resistor (R₂₄), while a Lo goes to the resistor (R₂₅). Thus, the signal at the summarizing point (F) between (R₂₄) and (R₂₅) is halfway between Hi and Lo, which is a forbidden zone signal that is delivered to the state data pin (158).

Two observations with respect to the interface pins (8) and (5) of the filter circuit board (38) during this forbidden zone analysis will be made for purposes of later analysis of the filter circuit board (38). First, in the forbidden zone, there is a Hi signal on the logic separator circuit interface pin (13), and thus on the filter circuit board interface pin (5). Secondly, the Hi on (U₈), pin (10) is delivered to (U₁₀), pin (4). When there is a Hi voltage on (U₁₀), pin (4), (U₁₀) is turned off. In that instance, the voltage out of (U₁₀), pin (8) is in the forbidden zone and is transferred through (R₂₆) to interface pin (14), and therefore to filter circuit board pin (8). Thus, in the forbidden zone, there is a voltage between 0.8V and 2.4V on the interface pin (8).

When the probe needle (82) is placed on a Hi voltage, the low output amplifier (U₂) does not change state, while the output of high output amplifier (U₁) changes state and goes to a Lo. Following the Lo output from amplifier (U₁), we find that (U₆), pin (6) is Lo. As was the case in the forbidden zone, (U₆), pin (5) is a Hi. Thus (U₆), a dual input NAND, has a Hi and a Lo input, resulting in a Hi output. Forbidden zone LED light (42), having a Hi on both sides, goes out.

Looking at Hi LED light (43), (U₆), pin (8) now has a Hi on it. Thus (U₆), pin (10) is Lo and LED light (43), having 5V on one side and Lo voltage on the other side, now lights up. Similarly, looking at Lo LED light (41), (U₆), pin (2) has a Lo and (U₆), pin (1) therefore is a Hi. Thus, as in the case of the forbidden zone situation, the LED light (41) is off.

When the guided-logic probe was in the forbidden zone, the latches (L₁) and (L₂) operated such that there was a Hi on (U₉), pin (3) as a result of Lo's on both (U₉), pin (1) and (U₉), pin (2). This situation existed by the fact that when the guided-logic probe box is hooked up to the computer (78) of the automatic test system (HATS), and the test patterns are to be run, pin (160) is Hi. It then goes Lo to establish the reset and then back Hi for reenabling. Following the voltages through latches (L₁) and (L₂) leads to a Hi on (U₉), pin (3) and thus a Hi out of the pin (159).

When the HATS station starts reading each test pattern, it will send a negative pulse from the pin (160) into the guided probe box (20). That negative pulse will cause the latches (L₁) and (L₂) to be put in the above state. The latch (L₁) will now be susceptible to a Lo on (U₇), pin (5) and the latch (L₂) will be susceptible to a Lo on (U₇), pin (9), and the voltages on (U₉), pins (1) and (2) will change state if the latches (L₁) and (L₂) are triggered in such a manner.

With the probe needle (82) now on a Hi, the lower latch (L₂) does not change state. But latch (L₁) now goes to a Lo input and (U₉), pin (2) goes to a Hi. Since going from the forbidden zone to a Hi does not represent a change in state (Lo to Hi or Hi to Lo), even though (U₉), pin (2) goes to a Hi, (U₉), pin (3) nevertheless remains a Hi because of the Lo on (U₉), pin (1). With (U₈), pin (4) now in a Hi, the point (F) now sees a Hi and the pin (158) sends a Hi signal to the HATS computer (78).

Looking at a change of state, probe needle (82) being placed on a Lo, the low output amplifier (U₂) changes state, to a Hi output. Now (U₇), pin (9) will go Lo. (U₉), pins (1) and (2) now are both Hi, and the pin (159) changes state to a Lo. There is, now a true transition of data. Also, the resistors (R₂₄) and (R₂₅) have two Lo's and the pin (158) signals the computer (78) that it is in the Lo state at that moment.

A hand probe bulb (84), shown in FIG. 9, will be described with reference to the filter circuit board (36) depicted in FIG. 9. The two NAND gates (U₁₀) apply the bulb (84), one through the resistor (R₁₂) and the other through the resistors (R₁₁) and (R₁₂). If the output of (U₁₀), pin (4) is in the Lo state the bulb (84) is turned on full bright by current through the bulb (84), through the resistor (R₁₂) and back to ground through (U₁₀), pin (4). If (U₁₀), pin (1) is Lo, then current through the bulb (84) goes through (R₁₁) and (R₁₂) and the bulb (84) is lit up in a dim state which represents the forbidden zone. If both (U₁₀), pin (4) or (U₁₀) pin (1) are Hi, then the bulb (84) is off.

For a forbidden zone condition, the interface point (5) is Hi, as discussed hereinabove with respect to FIG. 8, and the output of (U₂), pin (12) is therefore Lo. Thus, the clear lines for the D-type flip-flops (U₅) are all Lo. When the clear line of D-type flip-flops is low, the output (Q) is low, which means that in the forbidden zone (U₁₀), pin (5) is Lo. In the forbidden zone, since (Q) is Lo, then (Q̄) is Hi and (U₁₀), pin (2) is Hi. With (U₁₀), pin (4) and (U₁₀), pin (1) Lo, the bulb (84) is dim. Use of the three cascaded D-type flip-flops provides a delay (3 cycles of clocking) which prevents the bulb (84) from flashing when there is a change from the forbidden zone state, and the system is setting up.

Also as discussed hereinabove, in the forebidden zone there is a forbidden zone voltage on the interface pin (8). The resistors (R₅), (R₆), and (R₇) divide up the voltage such that the voltage on (U₆), pin (5) is lower than the voltage on (U₆), pin (10), and the voltage on (U₆), pin (9) is higher than the voltage on (U₆), pin (10). The result is that the outputs of (U₆), pin (7) and (U₆), pin (8) are both Lo in the forbidden zone. In accordance with this portion of the circuit, the output of (U₇), pin (10), and thus the input on (U₃), pin (3), will be Hi for the forbidden zone, Hi for a Lo state, and Lo for a Hi state. In like manner, the output of (U₇), pin (6) and the input on (U₃), pin (5) will be Hi for the forbidden zone, Lo for a Lo state, and Hi for a Hi state.

The low pass filter (122) in FIG. 9 transfers signals at frequencies of less than about 7.5 Hz to (U₆), pins (6) and (10). If the frequency is higher than about 7.5 H_z it will not be transferred through and the voltage levels will be the same as if it were in the forbidden zone. Thus, at frequencies lower than about 7.5 H_z, the light

(84) flashes at the same rate as the signal, while at frequencies higher than about 7.5 $H_z$, the light (84) will, in accordance with the oscillator ($U_1$) circuit, flash at 7.5 $H_z$ (visable to human eye). At the same time that the higher frequencies are limited to 7.5 $H_z$, the oscillator ($U_1$) sends its signals on to the bulb (84). Operation of the low pass filter (122) and the various oscillator paths are defined by the inverters ($U_2$), the NAND gates ($U_8$) and ($U_9$), the NOR gate ($U_3$), and the flip-flops ($U_4$) and ($U_5$), and can be summarized as follows:

| Signal | | Light (84) activity |
|---|---|---|
| Forbidden Zone | | Dim |
| Hi | | Bright |
| Lo | | Off |
| Positive Pulses | $\leq 7\frac{1}{2}$ $H_z$ | Flashes On at True Rate |
| Negative Pulses | $\leq 7\frac{1}{2}$ $H_z$ | Flashes Off at True Rate |
| Square Waves | $\leq 7\frac{1}{2}$ $H_z$ | Equal On/Off at True Rate |
| Positive Pulses | $\geq 7\frac{1}{2}$ $H_z$ | Flashes on at $7\frac{1}{2}$ Hz 1:2 $\frac{1}{2}$ duty cycle |
| Negative Pulses | $\geq 7\frac{1}{2}$ $H_z$ | Flashes Off at $7\frac{1}{2}$ Hz 1:2 $\frac{1}{2}$ duty cycle |
| Square Wave | $\geq 7\frac{1}{2}$ $H_z$ | Equal On/Off at $7\frac{1}{2}$ Hz 1:1 duty cycle |

The power supply for powering the guided-logic probe of the present invention must be capable of supplying plus and minus 12 volts to the probe, matched to within 1%. The power supply is shown in the schematic circuit of FIG. 10 and is of generally known design. Reference is made to the aforementioned copending United States Patent Application Ser. No. 191,048 for a more detailed description of the power circuit of FIG. 10 and additional descriptions of the capabilities of the guided-probe box (20).

TABLE I

| SWITCH CIRCUIT | | HAND PROBE CIRCUIT | | | |
|---|---|---|---|---|---|
| $R_1$ | 620 ohms | $R_1$ | 22K ohms | $C_1$ | 68 pf |
| $R_2$ | 270 ohms | $R_2$ | 10K ohms | $C_2$ | 1.0 $\mu f$ |
| $R_3$ | 330 ohms | $R_3$ | 47K ohms | $C_3$ | .1 $\mu f$ |
| $R_4$ | 750 ohms | $R_4$ | 470 ohms | | |
| $R_5$ | 270 ohms | $R_5$ | 1K ohms | | |
| $R_{15}$ | 500 ohms | $R_6$ | 75 ohms | | |
| $R_{17}$ | 500 ohms | $R_7$ | 470 ohms | | |
| $R_{18}$ | 500 ohms | | | | |
| $R_{21}$ | 500 ohms | | | | |
| $R_{22}$ | 500 ohms | | | | |
| $R_{23}$ | 500 ohms | | | | |

| FILTER CIRCUIT | | | |
|---|---|---|---|
| $R_1$ | 68K ohms | $C_1$ | 1 $\mu f$ |
| $R_2$ | 68K ohms | $C_2$ | 1 $\mu f$ |
| $R_3$ | 68K ohms | $C_3$ | .47 $\mu f$ |
| $R_4$ | 68K ohms | $C_4$ | 1 $\mu f$ |
| $R_5$ | 620 ohms | $C_5$ | 1 $\mu f$ |
| $R_6$ | 560 ohms | $C_6$ | .47 $\mu f$ |
| $R_7$ | 300 ohms | $C_7$ | .33 $\mu f$ |
| $R_8$ | 100K ohms | $C_8$ | 1 $\mu f$ |
| $R_9$ | 220K ohms | $C_{10}$ | .1 $\mu f$ |
| $R_{10}$ | 180K ohms | $C_{11}$ | .1 $\mu f$ |
| $R_{11}$ | 100 ohms | $C_{12}$ | .1 $\mu f$ |
| $R_{12}$ | 180 ohms | $C_{13}$ | .1 $\mu f$ |
| $R_{13}$ | 5.1K ohms | $C_{14}$ | .1 $\mu f$ |
| $R_{14}$ | 100K ohms | $C_{15}$ | 22 $\mu f$ |
| | | $C_{16}$ | .001 $\mu f$ |

| LEVEL DETECTOR CIRCUIT | | | |
|---|---|---|---|
| $R_1$ | 1K ohms | $C_1$ | 5.5-18 pf |
| $R_2$ | 150K ohms | $C_2$ | 5.5-18 pf |
| $R_3$ | 150K ohms | $C_3$ | .1 $\mu f$ |
| $R_4$ | 1K ohms | $C_4$ | .1 $\mu f$ |
| $R_5$ | 510 ohms | $C_5$ | .1 $\mu f$ |
| $R_6$ | 510 ohms | $C_6$ | 1 $\mu f$ |
| $R_7$ | 470 ohms | $C_7$ | .1 $\mu f$ |
| $R_8$ | 330K ohms | $C_8$ | 47 $\mu f$ |

TABLE I-continued

| $R_9$ | 470 ohms | $C_9$ | 47 $\mu f$ |
|---|---|---|---|
| $R_{10}$ | 240 ohms | $C_{10}$ | 5 pf |
| $R_{11}$ | 75 ohms | $C_{11}$ | 1 $\mu f$ |
| $R_{13}$ | 270 ohms | $C_{12}$ | .1 $\mu f$ |
| $R_{14}$ | 270 ohms | $C_{13}$ | 1 $\mu f$ |
| $R_{15}$ | 500 ohms | $C_{14}$ | 1 $\mu f$ |
| $R_{16}$ | 47K ohms | $C_{15}$ | .1 $\mu f$ |
| $R_{17}$ | 500 ohms | $C_{16}$ | 1 $\mu f$ |
| $R_{18}$ | 500 ohms | $C_{24}$ | .1 $\mu f$ |
| $R_{19}$ | 47K ohms | $C_{25}$ | .001 $\mu f$ |
| $R_{20}$ | 240 ohms | $C_{26}$ | .001 $\mu f$ |
| $R_{21}$ | 500 ohms | | |
| $R_{22}$ | 500 ohms | | |
| $R_{23}$ | 500 ohms | | |
| $R_{27}$ | 330K ohms | | |

| POWER SUPPLY CIRCUIT | | | |
|---|---|---|---|
| $R_1$ | 240 ohms | $C_1$ | 500 $\mu f$ |
| $R_2$ | 5K ohms | $C_2$ | 500 $\mu f$ |
| | | $C_3$ | 2.2 $\mu f$ |
| | | $C_4$ | 250 $\mu f$ |
| | | $C_5$ | .1 $\mu f$ |
| | | $C_6$ | 2.2 $\mu f$ |
| | | $C_7$ | .1 $\mu f$ |
| | | $C_8$ | 250 $\mu f$ |
| | | $C_9$ | .1 $\mu f$ |
| | | $C_{10}$ | 500 $\mu f$ |
| | | $C_{11}$ | 2.2 $\mu f$ |
| | | $C_{12}$ | .1 $\mu f$ |
| | | $C_{13}$ | 250 $\mu f$ |
| | | $C_{14}$ | .1 $\mu f$ |
| | | $C_{17}$ | 250 $\mu f$ |

| LOGIC SEPARATOR CIRCUIT | | | |
|---|---|---|---|
| $R_{12}$ | 330K ohms | $C_{17}$ | .1 $\mu f$ |
| $R_{24}$ | 1.8K ohms | $C_{18}$ | .1 $\mu f$ |
| $R_{25}$ | 1.8K ohms | $C_{19}$ | .1 $\mu f$ |
| $R_{26}$ | 1.2K ohms | $C_{20}$ | .01 $\mu f$ |
| | | $C_{21}$ | .1 $\mu f$ |
| | | $C_{22}$ | .1 $\mu f$ |
| | | $C_{23}$ | .1 $\mu f$ |

In an automatic test system, the probe must be able to determine if it is connected to a logic line, to determine the state of the logic line it is connected to, and to determine whether or not a pulse occurred on that logic line between pattern applications. The guided-logic probe box (20) described hereinabove acts as an intercept box with direct connections on most of the pins of the main intercept interface connector (12) on the HATS station.

Under the above arrangement of utilizing the guided probe system hardware of this invention as an intercept box with a HATS, all of the test pattern set identifications built without consideration for providing guided probe capability would not be affected nor require modification, allowing a single piece of hardware to be used to upgrade existing test pattern sets and allow for future test pattern set development work using a guided probe.

The guided-logic probe box (20) of the present invention is shown constructed in an intercept box form, with the female ZIF connector (74) on the bottom and the male ZIF connector (72) on the top. The retrofit kit items thus would be a HATS system disc containing the guided probe systems process (in software form) and a guided-logic probe intercept box (20).

For test pattern set development of most of the digital circuits, known computer-derived digital test simulation and generation systems, such as for example Logic Automated Stimulus and Response (LASAR) is used. LASAR is based on an equivalent NAND gate representation of a circuit. Almost all of the data required for doing a guided probe analysis of a faulty circuit is available from the LASAR system.

The test data required for performing a guided-probe fault diagnostic run are the stimulus states, the expected response states, the topological structure of the circuit, and the expected logical states of each circuit node at each pattern. LASAR intrinsically contains all of these data, except the circuit topology, since the LASAR system is based on an equivalent NAND topology. LASAR generates a fault dictionary in normal use. Test pattern set development for digital circuits is more of an art than a science.

To develop a test for all but the most simple digital circuits, an experienced analyst maked educated guesses about how a circuit should be modeled, what parts of the circuit should be modeled, where and which workarounds to use, what pattern sequences are likely to initialize the circuit, and how the circuit must be modeled to represent the initialization and timing of the circuit knowing the simulator algorithms.

The guided-logic probe (20) of this invention is an isolation tool and does not affect the fault-detection part of the test program; i.e., the end-to-end in a strict sense. The job of stimulus generation is complete when the fault coverage; i.e., fault detection, is high enough to meet the fault-detection requirements of the program, usually as stipulated by the user.

The process of guided probe in accordance with the present invention requires that logic-state data and pulse data be available to the tester, whether human or automatic (to the software system of an automatic test system). In the latter case, the guided-logic probe (20) is utilized as an intercept box on an automatic test system, in this instance a HATS. Communication between the guided-logic probe (20), used in this capacity, and the computer (78) of the HATS, is carried out via the pins (158), (159), and (160), as described hereinabove.

A "DO, GUIDED PROBE" statement on the HATS program disc could include a selection therein for the display that will come up on the screen when a probe is requested. Under normal circumstances, an English-language message appears on the CRT screen (18) indicating the integrated circuit and the pin number on that integrated circuit to be probed. The probing algorithm searches for a component that has no input failures, but has an output failure, and then calls it out as the failure. If desired, a verify mode may be provided in the statement, to verify the suspected cause to failure within the circuit.

The basis of the guided-probe process and algorithm is the assumption that the location of at least one of the failures in the digital circuit manifests itself in that all inputs to the component in which that failure exists are nominal and are the same as a good board and the output failed is different than a good board. To find this location, the earliest failure on the board must be found, both in terms of patterns and in terms of signal path. To trace signal paths, the probe algorithm directs the probe location from outputs of components back to the inputs of components. A signal path incorporating many components would be traced one component at a time. To identify the earliest failure, the test is run from the beginning of the test up to and including, if necessary, the failure pattern that is presently the earliest failure on the board. If the earliest sensed failure up to the time of probing, for example, is pattern 59, the test need only run to pattern 59 in order to verify that an earlier failure does not exist at the probe point.

There is an implication that a single failure will be identified by the guided-probe algorithm. There need not, however, be only one failure existing in the circuit for a single failure to be identified. If more than one failure exists in the circuit, the failure that causes the earliest failure in the board, both in terms of pattern and single flow, will be identified.

In the guided-probe algorithm, the history of the probe status is done based upon nodes as opposed to component pins. The history table will be as long as there are nodes in the circuit. This table contains the history for each node and retains whether or not a node has been probed and whether or not that node failed; and if the node did fail, at which pattern the failure occurred. Based upon the history table states, the algorithm determines the location that feeds the node that is the earliest failing node in order to determine whether or not that node has failed. If the feeding nodes have not failed, then a fault is identified. If a feeding node does fail, the process is repeated for the component that sources that node.

As stated hereinabove, one of the primary areas of difficulty or limitations upon prior art automatic test systems, and of course manual systems, is that of signal loops in the circuit. A signal loop manifests itself when a failure occurs in a circuit in such a way as to cause both inputs and outputs of several components to show erroneous states simultaneously, all the components arranged topologically in a loop structure. The problem then is to identify where in the loop the failure actually occurred. The process of the present invention is based upon the following premise: Having identified a loop, and assuming that a node at a point where failure shows up in the loop is being fed by signals outside the loop which are correct, i.e., there are no signal changes going on in the other inputs to that node, then that node cannot cause the fault to be introduced to that loop. This premise enables the analyzing and testing of nodes within the loop such that possible component causes of the fault may be systematically eliminated.

Stated another way, there is a possibility in digital circuitry that the failing component would have a failure on the input to that component on the same pattern that the failure on the output appears. This would be due to a feedback within the circuit. When feedback exists, and there is a failure loop around the feedback elements, the algorithm or process of the present invention treats all of the loop as if it were one component, and looks for the inputs to the loop for failures, to verify that the failure is within that feedback loop. If the failure is indeed within the feedback loop, the algorithm scans each input to the loop for an activity since the failing component within a feedback loop must have an activity on it on the falling pattern. If all of the components within the loop have activities on them on the same pattern that the failure first appears within the whole loop, then all of the components are called out. If only one of the components has activity on it during the pattern in which the failure appears, then only that component is called out.

Figure 11:
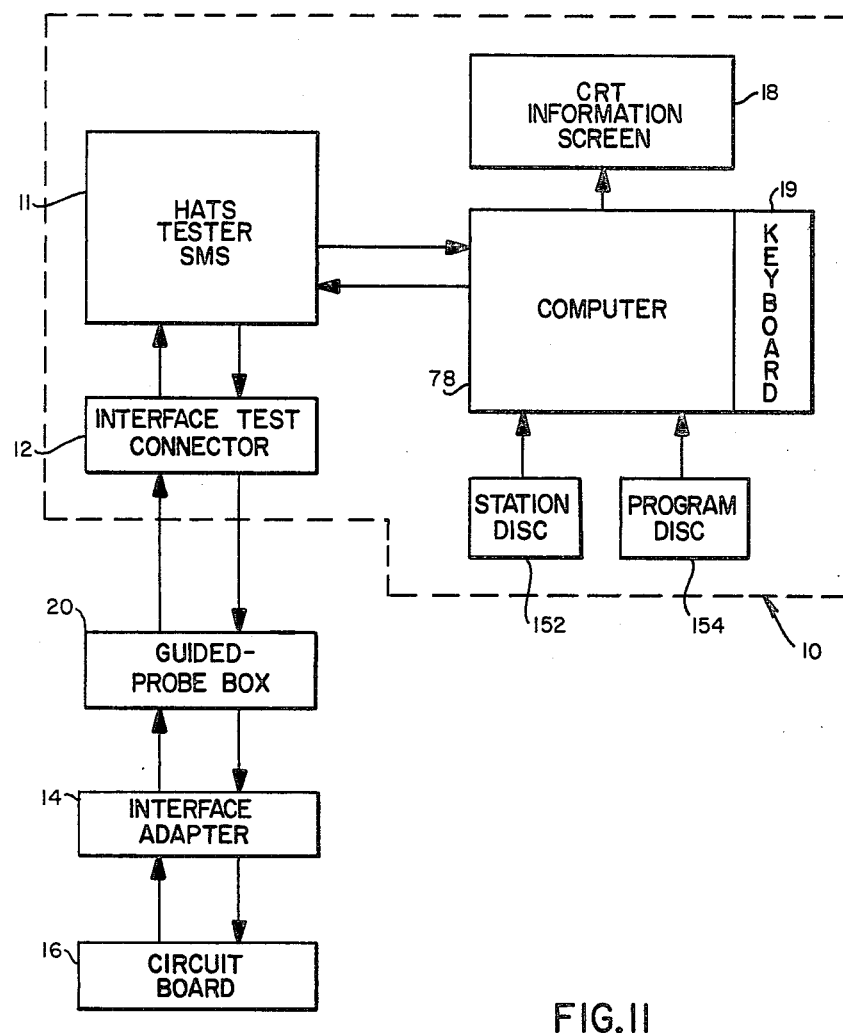
FIG. 11 is a block diagram showing the guided-probe box of the present invention interposed with elements of a Hybrid Automatic Test System (HATS)

Referring to FIG. 11, there is shown therein a block diagram of the modified HATS depicted in FIG. 1, showing the computer (78) of the HATS being fed test procedure and program information from the station disc (152) and the program disc (154). Both of these discs are standard HATS discs, with the exception that the program on the disc (154) is modified by the process of the present invention. The modification to the HATS program disc (154) is carried out in accordance with the FIG. 12 flow chart which is a process of signal loop reduction in accordance with another aspect of the instant invention. Thus, there is an insert to the HATS executive program which might, for example, be called "RUN GUIDED PROBE" or "DO, GUIDED PROBE". During general analysis, the computer (78), upon recognizing a signal loop condition, runs the process (algorithm) depicted in FIG. 12.

After initiation of the loop solving process, the computer (78) carries out a full loop call-out, and establishes a starting point by identifying a point in the loop to begin. The computer then finds pin data, as for example what the node being run is connected to, where it is connected, what kind of component(s) it is connected to, etc. It then makes the determination if the node is functional, that is, if the node is part of the loop. If no, the computer finds the next location the node is connected to and finds pin data. If yes, the computer initializes the loop trace table and puts those nodes of the loop in that table. The computer then makes the determination if there are any more inputs; if yes, they are put at the end of the list. THe computer is thus building up a table that has all of these inputs in it. When there are no more inputs, the computer initializes a probable cause of failure list. When there are no more loop inputs, the computer terminates the list, ends the program and prints a list of the probable causes of failure (PCOF's).

When there are more loop inputs, the computer initiates node state transfer and prepares to read if there is an activity at that point. In this step of the process, the computer, reading the node state table, determines whether a change has occurred on a node, goes to the appropriate place on the disc, and reads the next probe pattern. If no failure pattern is determined, it continues reading the next probe pattern. When a failure pattern is determined, the computer checks for activity, and when none is detected, returns to determine if there are any more loop inputs. When activity is detected, the computer checks to determine if there is anything in the probable cause of failure table. If not, the computer puts the node in the list and returns to determine if there are any more loop inputs. If there is something on the probable cause of failure table, the computer checks to see if the node being looked at is in the list. If it is, the computer returns to determine if there are any more loop inputs, if it isn't, the computer puts the node in the list and returns to determine if there are any more loop inputs.

Thus, the algorithm is an implementation of the statement that the circuit element responsible for introducing the failed state into a loop within a digital circuit must be connected to a node external to the loop that has logical activity at the same point in time that the failed condition presents itself in the loop.

Figure 12:
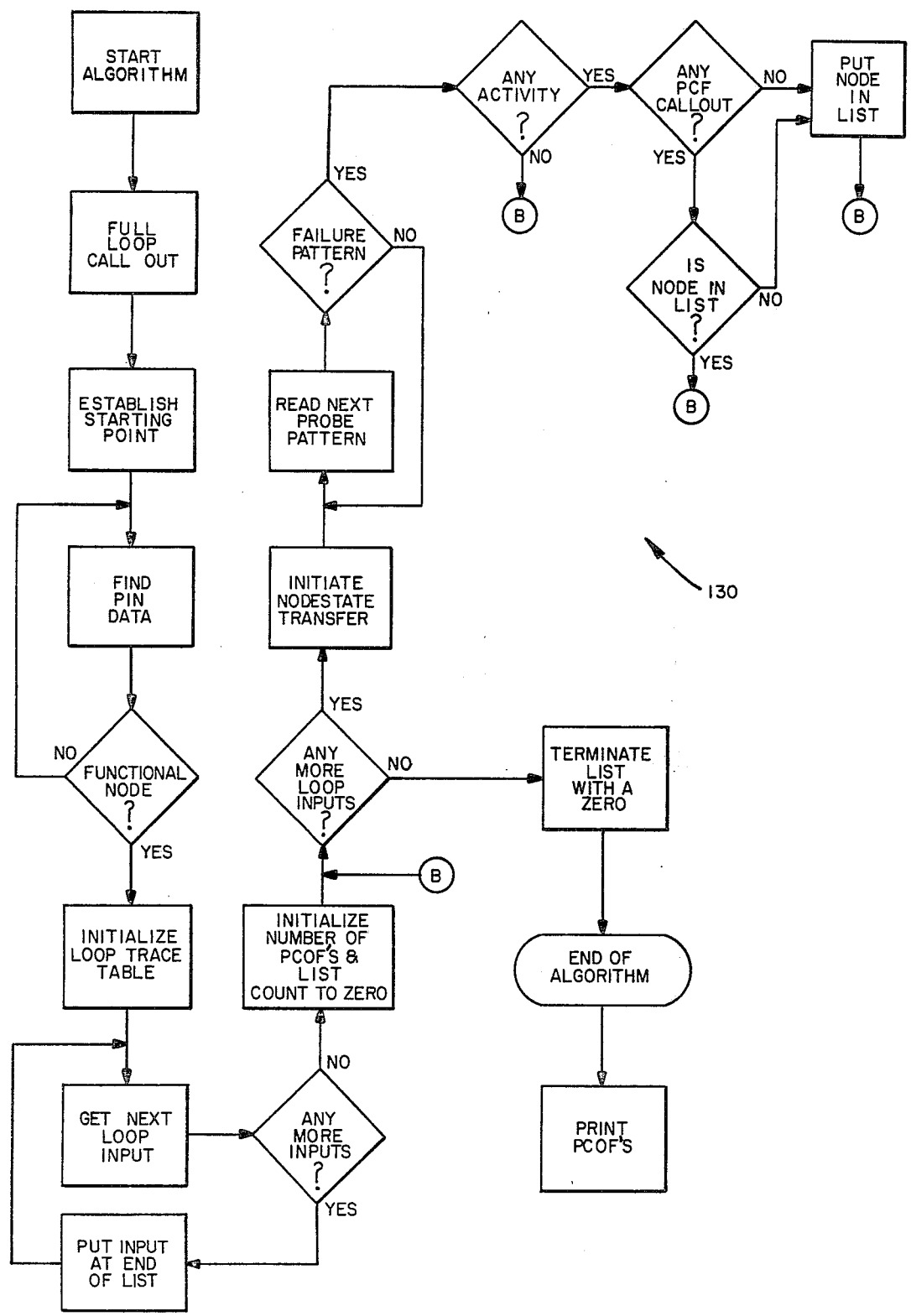
FIG. 12 is a flow diagram of the process of the present invention which enables identification of faulty component(s) within a circuit signal loop. Like numerals in the various drawing figures denote like parts.

Implementation of the process statement represented by the flow chart (130) of FIG. 12 is carried out via the software for the control computer (78) for the HATS. The software is incorporated with software resident on the computer (78), (ATLAS), whichis the station control executive. As stated hereinabove, a guided-probe statement is added which incorporates the loop reduction process. When a signal loop is detected, when all of the possible external data paths have been exhausted, each externally connected signal line is examined from the data base to determine whether or not an activity is present on the node at the point in time that the failure appears. Those elements which are connected to such node are tabulated in a list of possible causes of failure, which is presented to the testing personnel in the same way that other faults are identified.

It has been found from experience that the probable cause of failure list typically generated by the process and system of the present invention is usually only one long, with the average list for the circuits tested running about 1.3. In approximately 99% of the lists, the correct cause or causes of failure have been called out. By constrast, most prior art automatic test systems might typically provide average probable cause of failure lists 3 long, and the probability of failure within those 3 is typically about 90%. Thus, the system and process of the present invention not only eliminates ambiguity groups, but improves the probability of correctly identifying the probable cause of failures.

While the Digital Fault Loop Probe and System of the present invention has been described with reference to particular embodiments, it should be understood that such embodiments are merely illustrative, as there are numerous variations and modifications which may be made by those skilled in the art. Thus, the invention is to be construed as being limited only by the spirit and scope of the appended claims.

Industrial Applications

The Digital Fault Loop Probe and System of the present invention are useful for testing, locating and identifying the probable causes of failure within a faulty circuit under test.

We claim:

1. In a dynamic automatic test system for testing circuits, said system including a stimulus measurement system, a computer arranged for receiving and delivering signals from and to said stimulus measurement system, an information screen for receiving signals from said computer, an interface test connector electrically connected to said stimulus measurement system, and an interface adapter arranged for electronically connecting said interface test connector to said circuits, the improvement comprising:

a guided-logic probe box interposed between and connected to said interface adapter and said interface test connector, said guided-logic probe box including:

means for detecting Hi, Lo, forbidden zone, and impulse voltages generated by said circuit; and means for presenting signals representative of said generated voltages to said automatic test system computer, whereby said dynamic automatic test system is provided with a guided-probe capability.

2. A dynamic automatic test system as in claim 1 wherein said means for presenting said signals is adapted to present said signals simultaneously to both a human tester and said automatic test system computer, whereby said signals may simultaneously or alternatively be subjected to human and machine interpretation.

3. A dynamic automatic test system as in claim 2 wherein said guided-logic probe box includes a needle tipped hand probe adapted for contacting nodes of said circuits.

4. A dynamic automatic test system as in claim 1 wherein said probe box includes circuit means adapted to carry out logic functions for said voltage detecting and signal presenting probe capabilities.

5. A dynamic automatic test system as in claim 4 wherein said guided-logic probe box includes switch means, associated with said circuit means, for providing multiple family logic compatibility.

6. A dynamic automatic test system as in claim 4 wherein said circuit means includes hand probe, signal level detector, and logic separator circuits.

7. A dynamic automatic test system as in claim 6 wherein said signal level detector circuit is adapted to receive input voltages from said hand probe circuit, and based upon whether said voltages are Hi, Lo, or forbidden zone voltages, passes or doesn't pass a signal representative thereof through either of two operational amplifiers biased for preselected upper and lower levels of said forbidden zone.

8. A dynamic automatic test system as in claim 7 wherein said logic separator circuit is adapted to receive voltage signals from said signal level detector circuit and said Hi and Lo amplifiers, said logic separator circuit including means for separating out said Hi level, Lo level and forbidden zone signals.

9. A dynamic automatic test system as in claim 9 including Hi level, Lo level and forbidden zone indicator lights, said Hi level, Lo level and forbidden zone indicator lights being arranged relative to said separator circuit so that they light up when said separator circuit separates out Hi level, Lo level and forbidden zone signals, respectively.

10. A dynamic automatic test system as in claim 9 wherein said Hi level and Lo level lights are adapted, via said logic separator circuit, to flash on and off at a true time rate, in response to impulse signals transmitted from said hand probe and signal level detector circuits.

11. A dynamic automatic test system as in claim 10 wherein said circuit means includes a filter-oscillator circuit adapted to receive signals representative of said voltages from said logic separator circuit.

12. A dynamic automatic test system as in claim 4 wherein said hand probe includes an indicator lamp, the activity of said lamp being arranged to be controlled by said filter-oscillator circuit such that the following relationship between said voltage signals and said lamp activity is established:
  for forbidden zone signals—lamp lights dim;
  for Hi level signals—lamp lights bright;
  for Lo level signals—lamp off;
  for positive pulses below a preselected frequency—lamp flashes on at a true rate;
  for negative pulses below-said preselected frequency—lamp flashes off at a true rate;
  for square waves below said preselected frequency—lamp flashes equal on/off at a true rate;
  for positive pulses greater than said preselected frequency—lamp flashes on at said preselected frequency;
  for negative pulses greater than said preselected frequency—lamp flashes off at said preselected frequency; and
  for square waves greater than said preselected frequency—lamp flashes equal on/off at said preselected frequency.

13. A dynamic automatic test system as in claim 12 wherein said preselected frequency is about $7\frac{1}{2}$ H$_z$.

14. A dynamic automatic test system as in claim 6 wherein said logic separator circuit includes latch means whereby said voltage representative signals are latched internally in said logic separator circuit for presentation to a selected output pin of said separator circuit.

15. A dynamic automatic test system as in claim 14 wherein said selected output pin is a transition data pin adapted to provide a latch signal indicative of a change of state in said signals to said automatic test system computer.

16. A dynamic automatic test system as in claim 15 wherein said logic separator circuit inlcudes a signal state data pin and a transition reset pin, said transition reset pin being arranged in said logic separator circuit so as to be adapted to reset said latch means upon receipt of a reset signal from said computer.

17. A dynamic automatic test system as in claim 16 including connector means adapted for connecting said transition data, signal state data, and transition reset pins to said interface test connector.

18. A dynamic automatic test system as in claim 17 including switch means for adjusting said bias on said operational amplifiers for different preselected upper and lower levels of said forbidden zone.

19. A dynamic automatic test system as in claim 18 wherein said switch means comprises a selector switch for establishing said upper and lower levels of said forbidden zone for TTL, Hi level, and Lo level settings as follows:

| TTL | Hi = 2.4V | Lo = .8V |
|---|---|---|
| Hi Level | Hi = 4V | Lo = 2V |
| Lo Level | Hi = 1V | Lo = −1V |

20. A dynamic automatic test system as in any of claims 1, 2, 3, 4, 7, 10, 12, 16 or 18 wherein said probe is adapted to withstand Hi and Lo voltages of at least plus and minus thirty five volts.

21. In a dynamic automatic test system for testing digital circuits said system including a stimulus measurement system, a computer arranged for receiving and delivering signals from and to said stimulus measurement system, an information screen for receiving signals from said computer, an interface test connector electronically connected to said stimulus measurement system, and an interface adapter arranged for electronically connecting said interface test connector to said circuits, the improvement comprising:
  a guided-logic probe box interposed between and connected to said interface adapter and said interface test connector, said guided-logic probe box including:
  means for detecting Hi, Lo, forbidden zone, and impulse voltages generated by said circuits;
  means for presenting signals representative of said voltages to said computer; and
  means associated with said probe-box circuit means for providing multiple family logic compatibility.

22. A dynamic automatic test system as in claim 21 wherein said probe box circuit means is adapted to withstand high and low voltages of at least plus and minus thirty five volts.

23. A dynamic automatic test system as in claim 21 wherein said probe box circuit means includes two operational amplifiers, said means for providing multiple family logic compatibility comprising switch means associated with said circuit means for adjusting the bias on said amplifiers for upper and lower levels of said forbidden zone.

24. A process for identifying at least one faulty component causing a failed condition in a signal loop of a digital circuit, said digital circuit including at least two components and said signal loop including at least two components, comprising the steps of:

generating a pattern set for said circuit by applying logic states to the input nodes of said circuit and ascertaining the logic states on the output nodes of said circuit components;

reapplying different combinations of logic states to said input nodes and determining the output logic states for each combination, each combination being a pattern set;

carrying out said reapplying steps sequentially to establish a complete pattern set;

testing each input to said loop during said reapplying of different combinations of logic states to determine which nodes external to said signal loop have logical activity at the same point in time that the failed condition presents itself in said loop; and identifying each component in said signal loop which has said activity on it during the pattern in which the failure appears as the faulty component.

25. A process as in claim 24 wherein said signal loop itself is treated as a component, and further including the step of testing the input nodes to said loop for failures, to verify that said failure is within said signal loop.

* * * * *